United States Patent
Legen et al.

(10) Patent No.: US 7,253,514 B2
(45) Date of Patent: Aug. 7, 2007

(54) SELF-SUPPORTING CONNECTING ELEMENT FOR A SEMICONDUCTOR CHIP

(75) Inventors: Anton Legen, München (DE); Jochen Thomas, München (DE); Ingo Wennemuth, München (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/038,574

(22) Filed: Jan. 21, 2005

(65) Prior Publication Data
US 2005/0156308 A1    Jul. 21, 2005

(30) Foreign Application Priority Data
Jan. 21, 2004   (DE) .................... 10 2004 003 275

(51) Int. Cl.
*H01L 23/48*    (2006.01)
*H01L 25/065*   (2006.01)
*H01L 23/50*    (2006.01)
*H01L 23/52*    (2006.01)
*H01R 12/02*    (2006.01)

(52) U.S. Cl. .............................. 257/696; 257/E23.021; 257/E23.031; 257/E23.078; 257/E23.181; 257/E23.004; 257/E23.067; 257/734; 257/775; 257/776; 257/690; 257/692; 257/750; 257/688; 257/737; 257/633; 257/629; 257/698; 439/66; 439/91

(58) Field of Classification Search ........ 257/E23.021, 257/E23.031, E23.078, E23.181, E23.004, 257/E23.067, 690–693, 696, 698, 688, 750, 257/734, 737, 633, 629, 775, 776; 439/66, 439/91
See application file for complete search history.

(56) References Cited

U.S. PATENT DOCUMENTS

| | | | |
|---|---|---|---|
| 4,607,276 A |   | 8/1986 | Butt |
| 4,607,492 A | * | 8/1986 | Demus et al. ............... 62/55.5 |
| 4,827,611 A | * | 5/1989 | Pai et al. ...................... 29/843 |
| 5,420,461 A |   | 5/1995 | Mallik et al. |
| 5,457,879 A | * | 10/1995 | Gurtler et al. .............. 438/108 |
| 5,508,228 A | * | 4/1996 | Nolan et al. ................ 438/614 |
| 5,518,964 A | * | 5/1996 | DiStefano et al. .......... 438/113 |
| 5,632,627 A | * | 5/1997 | Aoki ........................... 439/67 |
| 5,984,693 A | * | 11/1999 | McHugh et al. .............. 439/66 |
| 5,998,875 A | * | 12/1999 | Bodo et al. ................. 257/778 |
| 6,176,008 B1 |   | 1/2001 | Ueoka |
| 6,268,662 B1 | * | 7/2001 | Test et al. .................... 257/784 |
| 6,307,159 B1 | * | 10/2001 | Soejima et al. ............. 174/250 |
| 6,523,794 B2 | * | 2/2003 | Ueno ....................... 248/188.1 |

(Continued)

FOREIGN PATENT DOCUMENTS

DE          199 46 497 A1    4/2001

(Continued)

*Primary Examiner*—Alexander Oscar Williams
(74) *Attorney, Agent, or Firm*—Edell, Shapiro & Finnan, LLC

(57) ABSTRACT

A connecting element for electrically connecting a semiconductor chip and a superordinate circuit board includes an elastic metal strip that is bent forming two metal limbs with flattened limb ends, thus forming a base between the metal limbs which is suitable for contacting and providing electrical connectivity to a plurality of contact pads of a superordinate circuit board. At least one of the two limb ends is electrically connected to the contact areas of a semiconductor chip, while the other limb end is elastically supported on the top side of the semiconductor chip, thereby enabling the connecting element to be self supporting.

16 Claims, 2 Drawing Sheets

U.S. PATENT DOCUMENTS

| | | | |
|---|---|---|---|
| 6,555,415 B2 * | 4/2003 | Hedler | 438/108 |
| 6,713,844 B2 * | 3/2004 | Tatsuta et al. | 257/629 |
| 6,774,480 B1 * | 8/2004 | Jiang | 257/701 |
| 6,957,963 B2 * | 10/2005 | Rathburn | 439/66 |
| 7,042,080 B2 * | 5/2006 | Kirby et al. | 257/692 |
| 2001/0028102 A1 | 10/2001 | Hacke | |
| 2002/0056922 A1 * | 5/2002 | Funaya et al. | 257/778 |
| 2002/0164893 A1 * | 11/2002 | Mathieu et al. | 439/66 |
| 2003/0057567 A1 | 3/2003 | Hedler et al. | |
| 2003/0067062 A1 * | 4/2003 | Hedler et al. | 257/678 |
| 2004/0130012 A1 * | 7/2004 | Hedler | 257/678 |
| 2004/0262758 A1 * | 12/2004 | Hashimoto | 257/750 |
| 2005/0048807 A1 * | 3/2005 | Li | 439/66 |
| 2005/0062153 A1 * | 3/2005 | Saito et al. | 257/737 |
| 2005/0067689 A1 * | 3/2005 | Hedler et al. | 257/706 |

FOREIGN PATENT DOCUMENTS

| | | | |
|---|---|---|---|
| EP | 0 792 519 B1 | | 9/1997 |
| JP | 4-236487 | * | 8/1992 |
| JP | 2002-75567 | * | 3/2002 |
| JP | 2003-75567 | | 3/2002 |

* cited by examiner

SELF-SUPPORTING CONNECTING ELEMENT FOR A SEMICONDUCTOR CHIP

CROSS REFERENCE TO RELATED APPLICATIONS

This application claims priority under 35 USC § 119 to German Application No. DE 10 2004 003 275.0, filed on Jan. 21, 2004, and titled "Connecting Elements on Semiconductor Chips for Semiconductor Components and Methods for Producing the Same," the entire contents of which are hereby incorporated by reference.

FIELD OF THE INVENTION

The present invention relates to connecting elements on semiconductor chips for semiconductor components for electrical connections between semiconductor chips and superordinate or printed circuit boards, and to a method for producing the connecting elements and applying the connecting elements on semiconductor chips.

BACKGROUND

As the size of chips increases, the problem of differences in thermal expansion between a semiconductor chip, for example, made of monocrystalline silicon, and a superordinate circuit board or a rewiring plate, for example, made of glass-fiber-reinforced epoxy resin, becomes more significant. Thus, in the case of the connecting elements used hitherto, such as, for example, flip-chip contacts, which have external contact balls or external contact bumps made of a solder alloy, there is the risk that sheer stresses on solder balls or solder bumps that are a few micrometers in size can no longer be reduced by plastic creepage or by plastic deformation. The consequence is that the connecting elements exhibit a tear-off risk that increases as the chip size increases. This tear-off risk can be alleviated in part by suitable plastics, which are also called "underfill," supporting the connecting elements, in particular, the flip-chip contacts, but this is associated with an increased production outlay.

Other solutions to the problem envisage using elastic external contacts having a rubber-elastic core and a metallic conductor track that nestles against the core. In this case, the metallic conductor track is not self-supporting, but rather relies on support from the rubber-elastic core, which is associated with an increased production costs for elastic connecting elements of this type.

A further solution, known as "microspring," provides wire-bonded, resilient metal wire constructions as connecting elements in order to enable the compensation in the coefficients of thermal expansion of, for example, silicon and epoxy resin. This solution also has low mechanical stability due to the bonding wires used, so that mechanical protection is required which increases the production costs for "microsprings" of this type, and thus the production costs, in particular, as a result of the serial production of the wire-bonded connecting elements.

To enable an elastic, compliant connection between contact areas of a semiconductor chip or of a semiconductor wafer and contact pads of a superordinate circuit board and reduce the tear-off risk of connecting elements is desirable.

SUMMARY

The present invention provides connecting elements on semiconductor chips for semiconductor components which are suitable for electrical connections between semiconductor chips and superordinate circuit boards. The term, "superordinate circuit board," means a higher-level printed circuit board. For this purpose, the connecting elements have an electrically conductive elastic metal in bent strip form with two metal limbs having flattened limb ends. At least one of the limb ends is fixed on an individual contact area of the contact areas of an active top side of the semiconductor chip. The second flattened limb end of the connecting element may be supported elastically on the top side of the semiconductor chip.

Connecting elements of this type are elastic in the x direction, the y direction, and the z direction. The limbs spread elastically or collide elastically. In the course of spreading and colliding, an adaptation in the z direction also becomes possible. As a result, it is possible to compensate for minimal differences in distance between a semiconductor chip and a superordinate circuit board. This property of the connecting elements according to the invention is particularly crucial for a "wafer level test." In a wafer level test, the semiconductor chips in the semiconductor positions of a semiconductor wafer are not fixedly connected to the board of a measurement head. Rather, the board with its contact pads of the measurement head is placed or pressed onto the individual semiconductor component positions of a semiconductor wafer.

Further, the connecting elements are not fitted to the measurement head, but may be present on the semiconductor chip and in each of the semiconductor component positions of a semiconductor wafer, so that the connecting elements are available simultaneously after separation of the semiconductor wafer into individual semiconductor chips for a product housing as external contacts of a semiconductor component.

In one exemplary embodiment of the invention, a semiconductor wafer has connecting elements on its contact areas in its semiconductor component positions. The above-mentioned testability of the semiconductor wafer in its entirety is possible. Also, the connecting elements, once they have been applied, are available as self-supporting connecting elements during the subsequent production steps of the semiconductor wafer to form semiconductor chip size components, for example, without additional production steps. These self-supporting, elastic, and stable connecting elements thus replace the external contacts of semiconductor component.

In order to improve the stability of the connecting elements as external contacts of semiconductor chip size semiconductor components, both limb ends are mounted on the top side of semiconductor chip, not just one flattened limb end. This production technique provides improved elasticity and improved stability of the new connecting elements. This increased stability by connecting two limb ends on the top side of a semiconductor chip, with at least one being electrically connected to one of the contact areas of the semiconductor chip, enables stabilization of the connecting elements not previously available.

In another exemplary embodiment of the invention, the connecting elements are oriented radially with respect to the centers of semiconductor chip positions of a semiconductor wafer. When a test head with contact pads is placed onto the bent metal strips of the connecting elements, the connecting elements with their free limb can yield to the pressure of the measurement head in the radial direction without being exposed to torsional loading. This prevents the elastic connecting elements from being torn off. In order to achieve high stability and at the same time high electrical conductivity, the connecting elements have copper, aluminum, gold, silver, or alloys thereof. In this case, the alloying additions serve to increase the elasticity and to prevent brittle fractures.

In yet another exemplary embodiment of the invention, the connecting elements are metal strips bent in U-shaped or V-shaped fashion. With the U or V shape, the two limbs can be bent to form flattened limb ends, which may be arranged parallel to the top side of the semiconductor chip during application of the connecting elements.

An exemplary range for the thickness of the connecting elements is between 3 and 100 micrometers and an exemplary range for the metal strip width of the connecting elements is between 25 and 1000 micrometers. These width and thickness dimensions show that the connecting elements according to the invention are micromechanical components that can be applied to the semiconductor chips or to corresponding semiconductor wafers.

Another exemplary embodiment of the invention provides for the connecting elements to have a relatively smaller width in the region of the limbs than at the flattened limb ends. With connecting elements of this type, their limb ends can be coordinated with the minimum dimensions of a contact pad without the stability of the connecting elements decreasing under these minimum dimensions, especially as the larger stable width of the limbs is retained. Connecting elements of this type make it possible for contact areas having dimensions of a few micrometers to be contact-connected and to be connected to contact pads on a superordinate circuit board by the connecting elements according to the invention.

A method for producing and applying connecting elements on semiconductor chips and/or on a semiconductor wafer includes providing a metal sheet or a metal tape. The size of the metal sheet or the metal tape corresponds to the minimum dimensions of a semiconductor chip or a semiconductor wafer. Then, there is pre-embossing of the metal sheet or of the metal tape, which may be combined with stamping tools or with etching techniques in order to implement a form of two-limbed bent metal strips of the connecting elements with flattened limb ends in accordance with a layout plan of the contact areas of a semiconductor wafer or of a semiconductor chip.

During pre-embossing, the connecting elements are not completely etched or stamped out from the metal sheet or the metal tape. Rather, the connecting elements remain in predetermined positions of the layout plan for the contact areas of the semiconductor wafer or a semiconductor chip. The tear-off region can include an indentation or a weakening of the sheet or metal tape material. The tear-off region is, for example, provided in a region near to the flattened limb ends of the connecting elements. The limb ends may be coated with a bonding substance prior to the pre-embossing of the metal sheet or the metal tape, whereas after the pre-embossing of the metal sheet or the metal tape.

Instead of limb ends, the contact areas of the semiconductor chip can have a coating of a bonding substance of this type. This coating of the bonding substance enables a material connection between at least one of the limb ends and the contact areas. For instance, the bonding substance is an adhesive filled with metal granules and is thus an electrically conductive material or a solder alloy.

After pre-embossing and coating, the pre-embossed metal sheet or metal tape is applied to a semiconductor chip or a semiconductor wafer and aligned such that at least one limb end of a connecting element is disposed opposite a respective contact area on the top side of the semiconductor chip or of the semiconductor wafer. At least one limb end of the connecting elements is subsequently connected or attached to the contact areas with the aid of the bonding substance. In the case of a conductive adhesive, pressing-on and curing of the conductive adhesive is used. In the case of a solder alloy used as a bonding substance, a soldering process is carried out in parallel and simultaneously for the connecting elements of a semiconductor chip or wafer. Finally, the metal sheet or the metal tape is removed from the semiconductor chip or semiconductor wafer and leaves behind the attached connecting elements with the tearing-off of the metal sheet or of the metal tape in the tear-off regions.

This method for producing and applying connecting elements on semiconductor chips and/or on semiconductor wafers provides that the attaching or connecting of the connecting elements is not effected serially as in the prior art, i.e., in the case of "microspring" technology. Rather, this is carried in out in parallel and simultaneously for the contact areas of a semiconductor chip or semiconductor wafer. Also, this method is not limited to the size of a semiconductor chip to which it can be applied. Rather, this method can be applied to semiconductor wafers of varying size with a varying number of contact pads in the individual semiconductor component positions of the semiconductor wafer. Finally, the pre-embossed tear-off region helps in tearing off the semiconductor sheet of the semiconductor tape from the respective semiconductor chip or the semiconductor wafer.

An alternative method for producing and applying connecting elements on semiconductor chips and/or on semiconductor wafers includes providing a metal sheet or metal tape. Then, there is pre-embossing with a complete stamping-out of two-limbed bent connecting elements with flattened limb ends from the metal sheet or from the metal tape. Consequently after this step, there are connecting elements with dimensions of a few micrometers, which are then shaken into depressions of a die. This shaking may be assisted by vibration of the die. The die has depressions adapted to the connecting element form. The depressions are arranged according to a layout plan of the contact areas of a semiconductor wafer or a semiconductor chip.

Once the positions of the depressions of the die have been filled with connecting elements, a semiconductor chip or semiconductor wafer is applied to the die and the contact areas are oriented according to the depressions of the die. Then, at least one limb end of the connecting elements on the contact areas of the semiconductor chip or of the semiconductor wafer for the connecting positions simultaneously is mounted or attached in parallel. For this purpose, a bonding substance is applied either on the flattened limb end to be connected or on the contact area prior to mounting. After mounting, the die is lifted off of the semiconductor chip or the semiconductor wafer and can be reused.

Parallel mounting of the connecting elements yields a production advantage over "microspring" technology.

Bulged structures of a plastics composition can be applied into the contact area region of a semiconductor wafer or semiconductor chip. A bent metal strip with corresponding limbs and flattened limb end is selectively electrodeposited on the bulged structures with simultaneous connection to the contact areas. In this procedure, after deposition of the bent connecting elements, the bulged plastic structures are resolved on the semiconductor wafer or the semiconductor chip, so that, in the place thereof and in the positions thereof, self-supporting, stable connecting elements remain on the semiconductor chip or the semiconductor wafer in the form of the bent metal strips.

In addition to parallel mounting of connecting elements to a semiconductor chip or a semiconductor wafer, in a further exemplary embodiment of the method, correspondingly prepared connecting elements are applied serially to semiconductor chips or semiconductor wafers. For this purpose, as in the previous methods, a metal sheet or a metal tape is provided, and individual connecting elements are then available as a result of pre-embossing and stamping-out of two-limbed bent connecting elements with flattened limb ends. These connecting elements are fed into an automatic placement machine. The automatic placement machine populates the contact areas of the semiconductor chips or the semiconductor wafers with connecting elements by mounting or attaching at least one of the flattened limb ends on the contact areas. With this serial method, conventional or slightly modified automatic placement machines for the application of connecting elements can be used.

In the event of temperature changes, different coefficients of thermal expansion of glass-fiber-reinforced epoxide circuit carriers and silicon semiconductor chips lead to high mechanical stresses in the connecting element between semiconductor chip and circuit carrier. Generally, compensation of these thermal expansions is undertaken by various components of the housing package, for example, solder balls, conductive adhesive, or other connecting structures. If it is necessary to achieve a higher integration density on a superordinate circuit carrier, then it is also necessary to reduce the size of the package housing. In this case, the semiconductor component size housings (chip scale packages), which have flip-chip contacts as connecting elements, are increasingly gaining in importance.

The highest integration density is possible with such housings, which are equipped with flip-chip contacts, because the chip area is equal to the product housing area. However, in the case of product housings based on flip-chip contacts, the incorporation of an elastic element between the semiconductor chip and the circuit carrier made of epoxy resin is very difficult. Consequently, the different thermal expansions are taken up by the connecting element, i.e., the flip-chip contact, in a soldering ball or a solder bump. A loadable connection can be achieved with relatively satisfactory reliability, however, only for small semiconductor chips having very small dimensions and a small number of flip-chip contacts or with the additional application of "underfill" plastics. However, solutions of this type are not satisfactory for memory chips, which have a comparatively large chip area.

The present invention disposes a connecting element between semiconductor chip and superordinate circuit carrier, which can be elastically deformed due to its geometrical form and the material used, and has relatively good thermal and electrical properties. Moreover, the mechanical stability of the connecting elements according to the invention is high enough to be able to dispense with additional supporting components, as in previous solutions.

A self-supporting, stable connecting element results from the V- or U-shaped connecting element structure made of a material having good electrical conductivity, such as copper, aluminum, silver, or gold. As shown by the methods described above, the connecting element can be worked from a sheet or a tape. The connecting element is fixed with its opening of the V or U shape in the direction of the semiconductor chip by a material connection, for example, adhesive bonding, soldering, or friction welding. In this case, in a first step, one limb of the connecting element is fixed in order to ensure a deformability, in particular, in the Z direction, for a subsequent test process at the wafer level. After a test step of this type, the free limb end can then be fixed on the semiconductor chip itself in a further process step.

The orientation of the contact elements is implemented for mobility in the main loading direction, for example, in the form of a concentric or radial orientation. If the connecting elements have already been fixed to the semiconductor chip, the connecting element may be connected to the contact pads on the circuit carrier by the customary production processes.

With the V- or U-shape, the connecting element can be relatively easily deformed elastically and this geometry substantially acts like a spring element. As a result, additional rubber-elastic components become superfluous in the housing region, which reduces production outlay and simplifies the mounting method.

BRIEF DESCRIPTION OF THE DRAWINGS

The invention will now be explained in more detail with reference to the accompanying drawings.

DETAILED DESCRIPTION

Figure 1:
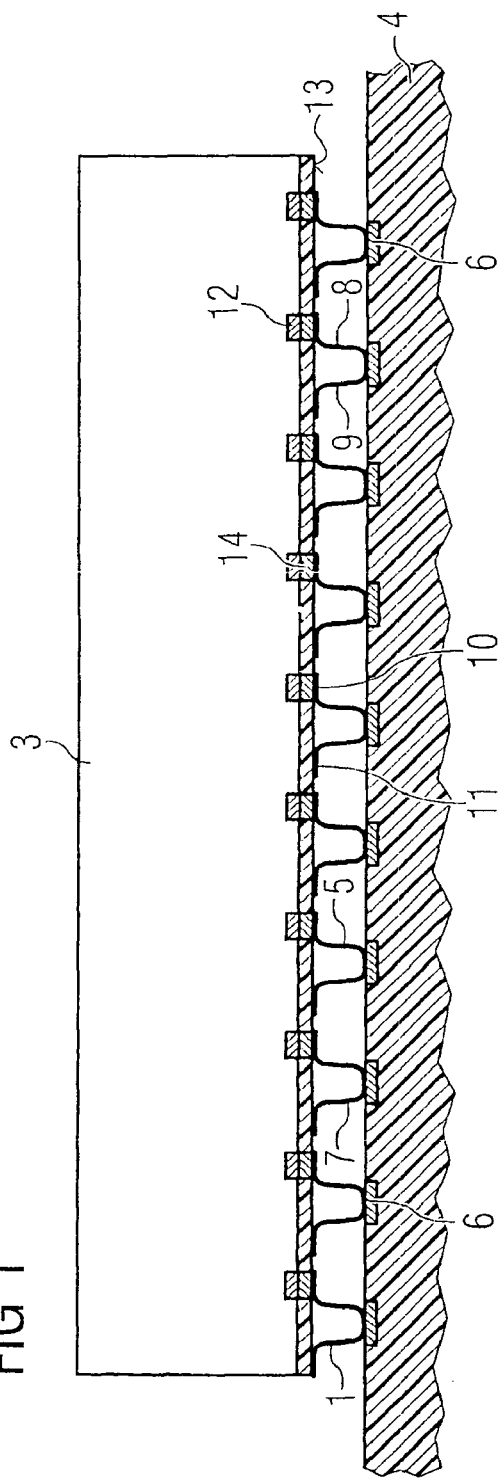
FIG. 1 shows a schematic cross-sectional view of a semiconductor chip or a segment of a semiconductor wafer with connecting elements in accordance with a first embodiment of the invention.

FIG. 1 shows a schematic cross-sectional view of a semiconductor chip 3 or a segment of a semiconductor wafer with connecting elements 1 in accordance with the first embodiment of the invention. The connecting element 1 on the semiconductor chip 3 forms an electrical connection 5 between the semiconductor chip 3 and a superordinate circuit board 4. In this embodiment, the connecting element 1 is bent in a U-shaped manner and has two limbs 8 and 9, which undergo transition to flattened limb ends 10, 11. The open end of the U-shaped connecting element 1 is directed in the direction of the active top side 13 of the semiconductor chip 3. Consequently, the flattened limb ends 10, 11 are situated on the active top side. At least one limb end 10 is electrically connected to a respective contact area 12 on the active top side 13 of the semiconductor chip 3 by a bonding substance 14.

The closed end of the U-shaped connecting element or the base is fixed on contact pads 6 of a superordinate circuit board 4, so that, between the semiconductor chip 3 and the circuit board 4, at least one elastic limb 8 of the U-shaped connecting element produces an electrical connection between the semiconductor chip 3 and the superordinate circuit board 4. The superordinate circuit board 4 may have a module having a plurality of semiconductor chips 3 associated with rewiring plate, for example. In this case, contact areas 12 of the semiconductor chip 3, which are a few micrometers in size, are connected to external contacts of a semiconductor component or semiconductor module, which are a few hundred micrometers in size by the contact pads 6 of the circuit board 4 and by rewiring lines.

A high contact density is achieved by these connecting elements 1 on the active top side 13 of the semiconductor chip 3, especially as the flattened circuit ends can be adapted in size to the contact areas 12 of the semiconductor chip 3 without impairing the stability and elasticity of the connecting element 1. As long as the second flattened limb end 11 of the connecting elements is not fixed on the top side 13, but rather is supported by the top side 13, a high flexibility and elasticity of the connections between semiconductor chips 3 and superordinate circuit board 4 is ensured even in the z direction, so that the differences in the coefficients of thermal expansion between the semiconductor chip 3 and the superordinate circuit board 4 do not lead to defects and tearing off. The second flattened limb end 11 of the connecting elements 1 may also be fixed on the active top side of the semiconductor chip 3. The connection between semiconductor chip 3 and superordinate circuit board 4 would thus become relatively stiffer, yet provide relative elasticity due to the U-shaped bending of the connecting element 1.

Figure 2:
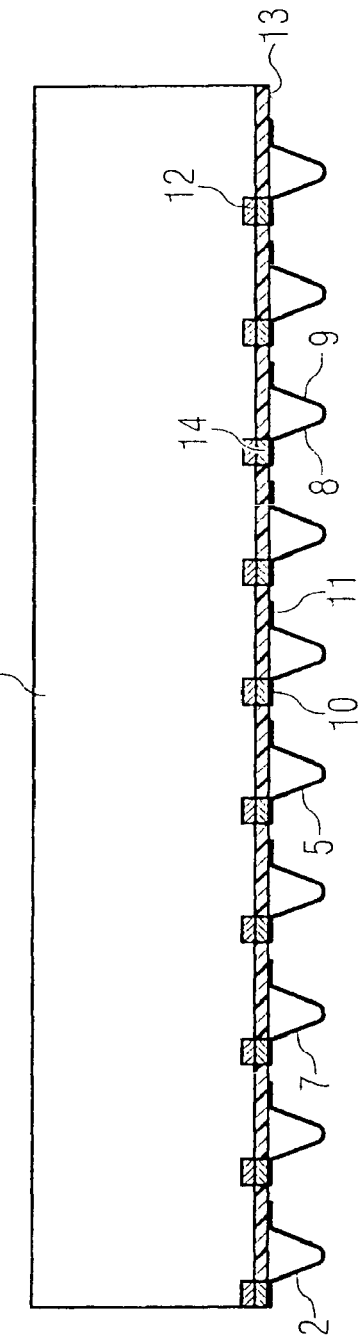
FIG. 2 shows a schematic cross-sectional view of a semiconductor chip or a segment of a semiconductor wafer with connecting elements in accordance with a second embodiment of the invention.

FIG. 2 shows a schematic cross-sectional view of a semiconductor chip 3 or a segment of a semiconductor wafer with connecting elements 2 in accordance with a second embodiment of the invention. Components having functions identical to those in FIG. 1 are identified by the same reference symbols and not discussed separately.

The connecting element 2 of the second embodiment of the invention differs from the connecting element 1 in that the connecting element 2 has a V-shaped cross section. This V-shape furthermore increases the stiffness of the connecting element and nevertheless ensures that the elastic displacement in the x and y directions, i.e., parallel to the top side 13 of the semiconductor chip 3, due to differences in the coefficients of expansion of semiconductor chip 3 and the superordinate circuit board (not shown here), can be compensated for without concern that the connecting elements will be torn off.

Figure 3:
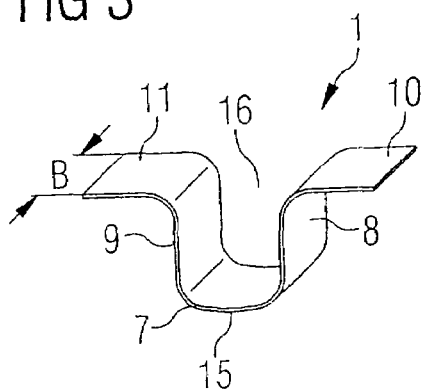
FIG. 3 shows a perspective view of a connecting element as in the embodiment of the invention of FIG. 1.

FIG. 3 shows a perspective view of a connecting element 1 as in the embodiment of the invention of FIG. 1. Whereas FIG. 1 shows the U-shaped cross section of the connecting element 1 and the interaction of the electrical connection between contact areas of the semiconductor chip and contact pads of the superordinate circuit board, the width B of the connecting element 1 can be seen in FIG. 3. The connecting element 1 thus includes an electrically conductive metal strip made of copper, aluminum, silver, gold, or alloys thereof, which is bent such that two free limbs 8 and 9, a base 15, and flattened limb ends 10, 11 are produced from the metal strips.

The base 15 may be brought into contact with the superordinate circuit board and the contact pads thereof, or be connected by a material joint to the contact pads of the superordinate circuit board. Of the two flattened limb ends 10, 11, the limb end 10, as seen in FIG. 1, is electrically connected to the contact areas of the semiconductor chip. The opening region 16 of the metal strip that is bent in a U-shape manner is oriented in the direction of the active top side of the semiconductor chip.

Figure 4:
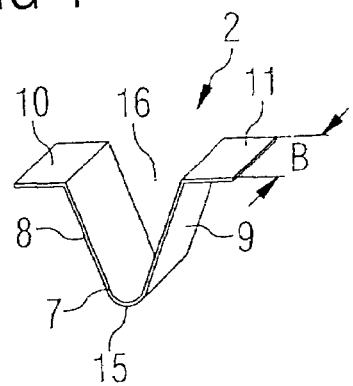
FIG. 4 shows a perspective view of a connecting element as in the embodiment of the invention of FIG. 2.

FIG. 4 shows a perspective view of a connecting element 2 as in the embodiment of the invention of FIG. 2. Components having functions identical to those in the previous figures are identified by the same reference symbols and are not discussed separately. The difference between the connecting element 1 and the connecting element 2 is that the metal strip in FIG. 4 is bent in a V-shaped manner and has self-supporting limbs 8, 9, which undergo transition to flattened limb ends 10, 11. In the case of this embodiment of the invention as well, the base 15 of the V-shape is relatively elastic with respect to the limb ends. The opening region 16 may again be oriented with respect to the active top side of the semiconductor chip.

Figure 5:
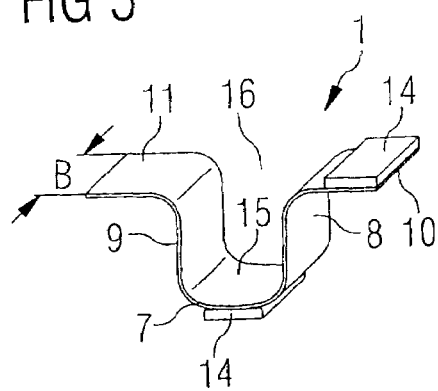
FIG. 5 shows a perspective view of a connecting element with coatings made of a bonding substance in accordance with the embodiment of the invention of FIG. 1.

FIG. 5 shows a perspective view of a connecting element 1 as in the embodiment of the invention of FIG. 1. The connecting element 1 has coatings of a bonding substance 14. The bonding surfaces 14 may be a solder material or an adhesive material, or constitute a friction-weldable alloy. This coating with the bonding substance 14 is applied on at least one of the flattened limb ends 10 in order to make contact with contact areas of the semiconductor chip, and is arranged on the base 15 in order to produce the connection to the contact pads of a superordinate circuit carrier.

Figure 6:
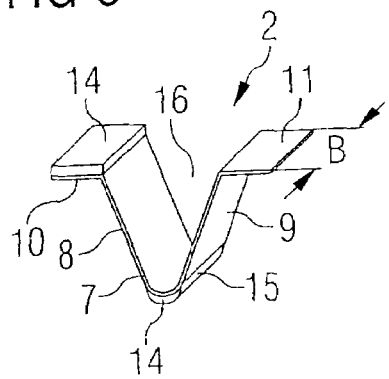
FIG. 6 shows a perspective view of a connecting element with coatings made of a bonding substance in accordance with the embodiment of the invention of FIG. 2.

FIG. 6 shows a perspective view of a connecting element 2 as in the embodiment of the invention of FIG. 2. The connecting element 2 has coatings made of a connecting substance 14. Components having functions identical to those in FIG. 1 are identified by the same reference symbols and not discussed separately. FIG. 6 shows the V-shaped cross-section of the connecting element 2, which is covered with the bonding substance 14 on its base 15, so that the metal strips and contact pads of a superordinate circuit carrier are connected. Also, a coating made of bonding substance 14 is arranged on one of the flattened limb ends 10.

Alternately, rather than coating a bonding substance 14 on one of the two flattened limb ends 10, 11 of the connecting element 2, both flattened limb ends 10, 111 can be coated with a bonding substance 14. Also, a bonding substance 14 can be arranged only on the contact areas of the semiconductor chip and/or on the contact pads of the superordinate circuit carrier and for the metal strip, as shown in FIGS. 3 and 4, to be kept completely free of a bonding substance.

Figure 7:
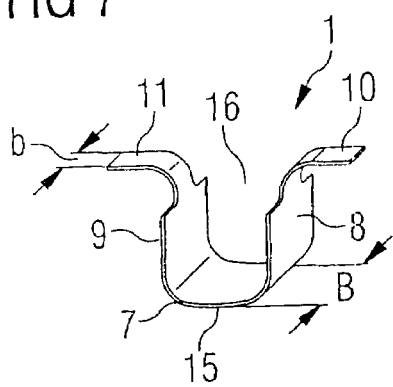
FIG. 7 shows a perspective view of a connecting element with flattened limb ends which have a reduced width in accordance with the embodiment of the invention of FIG. 1.

FIG. 7 shows a perspective view of a connecting element 1 as in the embodiment of the invention of FIG. 1. The connecting element 1 has flattened limb ends 10, 11 with a reduced width b. The width b, reduced compared with the width B of the metal strip 7, may become necessary if the contact pads of the semiconductor chip or the semiconductor wafer vary in the range of a few micrometers, so that, with the larger width B of the metal strip, a sufficient stability is achieved for the connecting element and a reliable connection to the contact pads of the semiconductor chip which are a few micrometers in size can nevertheless be ensured.

Figure 8:
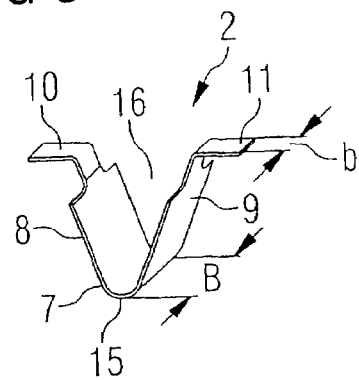
FIG. 8 shows a perspective view of a connecting element with flattened limb ends which have a reduced width in accordance with the embodiment of the invention of FIG. 2.

FIG. 8 shows a perspective view of a connecting element 2 as in the embodiment of the invention of FIG. 2. The connecting element 2 has flattened limb ends 10, 11 with a reduced width b. Components having functions identical to those in the previous figures are identified by the same reference symbols and are not discussed separately. The flattened limb ends 10, 11 may have a reduced width b in order to adapt to the size of contact areas of the semiconductor chip. Also, only one limb end of the two flattened limb ends 10, 11 may have a reduced width b, while the other limb end has the full width B of the metal strip. The latter is used when at least the limb end having a reduced width is intended to be fixed on a contact area, while the other flattened limb end is intended to be supported on the top side of the semiconductor chip outside the region of a contact area.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of reference symbols

| | |
|---|---|
| 1 | Connecting element |
| 2 | Connecting element |
| 3 | Semiconductor chip |
| 4 | Circuit board |
| 5 | Electrical connection |
| 6 | Contact pad |
| 7 | Metal strip |
| 8 | Metal limb |
| 9 | Metal limb |
| 10 | Limb end |
| 11 | Limb end |
| 12 | Contact area |
| 13 | Active top side |
| 14 | Bonding substance |
| 15 | Base of the U or V shape |
| 16 | Opening region of the U or V shape |
| B | Width of the metal strip |
| b | Reduced width of the limb ends |

What is claimed is:

1. A connecting element for electrically connecting a semiconductor chip and a superordinate circuit board, comprising:
an electrically conductive elastic metal strip that is bent to form two metal limbs with flattened limb ends, thus forming a base between the metal limbs, the base being suitable for contacting and providing electrical connectivity to a contact pad of the superordinate circuit board, wherein at least one of the flattened limb ends is configured to be fixed on a contact area of a top side of the semiconductor chip and, the other of the flattened limb ends is configured to engage the top side of the semiconductor chip such that, in situ with the semiconductor chip, the metal limbs extend from the top side of the semiconductor chip such that the metal limbs are not in contact with an underlying member, the connecting element thereby being self supporting.

2. The connecting element according to claim 1, wherein the connecting element is configured to be arranged on the contact area of the semiconductor chip while the semiconductor chip remains connected to other semiconductor chips in wafer form.

3. The connecting element according to claim 1, wherein the connecting element comprises copper, aluminum, gold, silver, or alloys thereof.

4. The connecting element according to claim 1, wherein both flattened limb ends of the connecting element are fixed on the top side of the semiconductor chip.

5. The connecting element according to claim 1, wherein the connecting element is bent in a U-shape or a V-shape.

6. The connecting element according to claim 1, wherein the metal strip of the connecting element has a thickness in the range of 3 to 100 micrometers.

7. The connecting element according to claim 1, wherein the metal strip of the connecting element has a width in the range of 25 to 1000 micrometers.

8. The connecting element according to claim 1, wherein the flattened limb ends of the connecting element have a width less than a width of portions of the two metal limbs extending from the base.

9. A semiconductor chip, comprising:
a plurality of contact areas; and
a plurality of connecting elements each comprising a connecting element for electrically connecting the semiconductor chip and a superordinate circuit board, the connecting element comprising:
an electrically conductive elastic metal strip that is bent to form two metal limbs with flattened limb ends, thus forming a base between the metal limbs, the base being suitable for contacting and providing electrical connectivity to a contact pad of the superordinate circuit board, wherein at least one of the flattened limb ends is configured to be fixed on a contact area of a top side of the semiconductor chip and, the other of the flattened limb ends is configured to engage the top side of the semiconductor chip such that, in situ with the semiconductor chip, the metal limbs extend from the top side of the semiconductor chip such that the metal limbs are not in contact with an underlying member, the connecting element thereby being self supporting;
wherein at least one of the flattened limb ends of each of the connecting elements is fixed to one of the contact areas of the semiconductor chip.

10. The semiconductor chip according to claim 9, wherein the connecting element is configured to be arranged on the contact area of the semiconductor chip while the semiconductor chip remains connected to other semiconductor chips in wafer form.

11. The semiconductor chip according to claim 9, wherein the connecting element comprises copper, aluminum, gold, silver, or alloys thereof.

12. The semiconductor chip according to claim 9, wherein both flattened limb ends of the connecting element are fixed on the top side of the semiconductor chip.

13. The semiconductor chip according to claim 9, wherein the connecting element is bent in a U-shape or a V-shape.

14. The semiconductor chip according to claim 9, wherein the metal strip of the connecting element has a thickness in the range of 3 to 100 micrometers.

15. The semiconductor chip according to claim 9, wherein the metal strip of the connecting element has a width in the range of 25 to 1000 micrometers.

16. The semiconductor chip according to claim 9, wherein the flattened limb ends of the connecting element have a width less than a width of portions of the two metal limbs extending from the base.

* * * * *